(12) United States Patent
Lelental et al.

(10) Patent No.: US 6,893,790 B2
(45) Date of Patent: May 17, 2005

(54) PHOTOPATTERNING OF CONDUCTIVE ELECTRODE LAYERS CONTAINING ELECTRICALLY-CONDUCTIVE POLYMER PARTICLES

(75) Inventors: Mark Lelental, Rochester, NY (US); Charles C. Anderson, Penfield, NY (US); Yongcai Wang, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 35 days.

(21) Appl. No.: 10/648,419

(22) Filed: Aug. 26, 2003

(65) Prior Publication Data

US 2005/0048405 A1 Mar. 3, 2005

(51) Int. Cl.$^7$ .......................... G03C 1/85; G03C 8/04; G03C 8/08; G03C 8/26; G03F 7/11
(52) U.S. Cl. ...................................... 430/138; 430/202
(58) Field of Search ................................ 430/138, 202

(56) References Cited

U.S. PATENT DOCUMENTS

| | | | |
|---|---|---|---|
| 4,070,189 A | | 1/1978 | Kelley et al. |
| 4,731,408 A | | 3/1988 | Jasne |
| 4,910,118 A | * | 3/1990 | Adair et al. ............ 430/138 |
| 4,987,042 A | | 1/1991 | Jonas et al. |
| 5,093,439 A | | 3/1992 | Epstein et al. |
| 5,300,575 A | | 4/1994 | Jonas et al. |
| 5,312,681 A | | 5/1994 | Muys et al. |
| 5,354,613 A | | 10/1994 | Quintens et al. |
| 5,370,981 A | | 12/1994 | Krafft et al. |
| 5,372,924 A | | 12/1994 | Quintens et al. |
| 5,391,472 A | | 2/1995 | Muys et al. |
| 5,403,467 A | | 4/1995 | Jonas et al. |
| 5,443,944 A | | 8/1995 | Krafft et al. |
| 5,561,030 A | | 10/1996 | Holdcroft et al. |
| 5,575,898 A | | 11/1996 | Wolf et al. |
| 5,665,498 A | | 9/1997 | Savage et al. |
| 5,674,654 A | | 10/1997 | Zumbulyadis et al. |
| 5,716,550 A | | 2/1998 | Gardner et al. |
| 5,783,353 A | | 7/1998 | Camillus et al. |
| 5,976,274 A | | 11/1999 | Inoue et al. |
| 6,045,977 A | | 4/2000 | Chandross et al. |

FOREIGN PATENT DOCUMENTS

| | | |
|---|---|---|
| EP | 0 252 410 | 6/1987 |
| EP | 440 957 A | 3/1996 |
| EP | 615 256 A | 9/1998 |
| EP | 1 079 397 A1 | 2/2001 |
| EP | 686 662 A | 11/2002 |
| EP | 1 054 414 A | 3/2003 |

OTHER PUBLICATIONS

Research Disclosure, Nov. 1998, p. 1473 (item No. 41548).
Co–pending U.S. Appl. No. 10/648,418, Lelental et al., Electrographic Patterning of Conductive Electrode Layers Conating Electrically Conductive Polymeric Materials (D–83943).
Co–pending U.S. Appl. No. 10/648,420, Anderson et al., Patterning of Electrically Conductive Layers by Ink Printing Methods (D–83879).
Co–pending U.S. Appl. No. 10/648,421, Burberry et al., Method of Patterning an Electroconductive Layer on a Support (D–84232).

* cited by examiner

*Primary Examiner*—Richard L. Schilling
(74) *Attorney, Agent, or Firm*—Doreen M. Wells

(57) ABSTRACT

A method for producing an electrode pattern in a conductive polymer disposed on a substrate, the method comprising the steps of: applying a layer containing a conductive polymer on a substrate; and printing a pattern on said layer using a printing solution containing a conductivity enhancing agent such that the resistivity of the areas that are contacted with the printing solution decreases by at least a factor of 10. A formulation and a thin film element for performing the method are also disclosed.

39 Claims, No Drawings

PHOTOPATTERNING OF CONDUCTIVE ELECTRODE LAYERS CONTAINING ELECTRICALLY-CONDUCTIVE POLYMER PARTICLES

CROSS REFERENCE TO RELATED APPLICATIONS

This application relates to commonly assigned copending application Ser. No. 10/648,420 (DN 83879), entitled PATTERNING OF ELECTRICALLY CONDUCTIVE LAYERS BY INK PRINTING METHODS, application Ser. No. 10/648,418 (DN83493), entitled ELECTROGRAPHIC PATTERNING OF CONDUCTIVE ELECTRODE LAYERS CONTAINING ELECTRICALLY-CONDUCTIVE POLYMERIC MATERIALS, application Ser. No. 10/648,421 (DN 84232), entitled METHOD OF PATTERNING AN ELECTROCONDUCTIVE LAYER ON A SUPPORT, all filed simultaneously herewith. The copending applications are incorporated by reference herein for all that they contain.

FIELD OF THE INVENTION

This invention is directed to the manufacturing of patterned transparent electrode arrays.

In general, this invention relates to patterning of transparent two and three dimensional thin film electrode elements, and in particular to photopatterning of electrically-conductive thin film elements comprising a support, and a photopattemable electrically-conductive layer. More specifically, this invention relates to electrically-conductive layers containing a polymeric binder, electronically-conductive polymer particles, photoreleasable, conductivity-enhancing or conductivity-degrading conductivity modifier encapsulated in photohardenable microcapsules and to the use of such photopatternable thin film formulations for such purposes as providing two- and three-dimensional electrode arrays.

BACKGROUND OF THE INVENTION

Transparent electrically-conductive layers (TCL) of metal oxides such as indium tin oxide (ITO), antimony doped tin oxide, and cadmium stannate (cadmium tin oxide) are commonly used in the manufacture of electrooptical display devices such as liquid crystal display devices (LCDs), electroluminescent display devices, photocells, solid-state image sensors or electrochromic windows.

Devices such as flat panel displays typically contain a substrate provided with an indium tin oxide (ITO) layer as a transparent electrode. The coating of ITO is carried out by vacuum sputtering methods, which involve high substrate temperature conditions up to 250 ° C., and therefore, glass substrates are generally used. The high cost of the fabrication methods and the low flexibility of such electrodes, due to the brittleness of the inorganic ITO layer as well as the glass substrate, limit the range of potential applications. As a result, there is a growing interest in making all-organic devices, comprising plastic resins as a flexible substrate and organic electroconductive polymer layers as an electrode. Such plastic electronics allow low cost devices with new properties.

Flexible plastic substrates can be provided with an electroconductive polymer layer by continuous hopper or roller coating methods (compared to batch process such as sputtering) and the resulting organic electrodes enable the "roll to roll" fabrication of electronic devices which are more flexible, cost less, and are lower in weight.

Intrinsically conductive polymers have recently received attention from various industries because of their electronic conductivity. Although many of these polymers are highly colored and are less suited for TCL applications, some of these intrinsically conductive polymers, such as substituted or unsubstituted pyrrole-containing polymers (as mentioned in U.S. Pat. Nos. 5,665,498 and 5,674,654), substituted or unsubstituted thiophene-containing polymers (as mentioned in U.S. Pat. Nos. 5,300,575, 5,312,681, 5,354,613, 5,370,981, 5,372,924, 5,391,472, 5,403,467, 5,443,944, 5,575,898, 4,987,042, and 4,731,408) and substituted or unsubstituted aniline-containing polymers (as mentioned in U.S. Pat. Nos. 5,716,550, 5,093,439, and 4,070,189) are transparent and not prohibitively colored, at least when coated in thin layers at moderate coverage. Because of their electronic conductivity instead of ionic conductivity, these polymers are conducting even at low humidity.

EP-A-440 957 describes a method for preparing polythiophene in an aqueous mixture by oxidative polymerization in the presence of a polyanion as a doping agent. In EP-A-686 662, it has been disclosed that highly conductive layers of polythiophene, coated from an aqueous coating solution, could be made by the addition of a di- or polyhydroxy and/or a carbonic acid, amide or lactam group containing compound in the coating solution of the polythiophene. Coated layers of organic electroconductive polymers can be patterned into electrode arrays using different methods. The known wet-etching microlithography technique is described in WO97/18944 and U.S. Pat. No. 5,976,274 wherein a positive or negative photoresist is applied on top of a coated layer of an organic electroconductive polymer, and after the steps of selectively exposing the photoresist to UV light, developing the photoresist, etching the electroconductive polymer layer and finally stripping the non-developed photoresist, a patterned layer is obtained. In U.S. Pat. No. 5,561,030, a similar method is used to form the pattern except that the pattern is formed in a continuous layer of prepolymer which is not yet conductive and, after washing the mask away, the remaining prepolymer is rendered conductive by oxidation. Such methods that involve conventional lithographic techniques are cumbersome as they involve many steps and require the use of hazardous chemicals.

EP-A-615 256 describes a method to produce a pattern of a conductive polymer on a substrate that involves coating and drying a composition containing 3,4-ethylenedioxythiophene monomer, an oxidation agent, and a base; exposing the dried layer to UV radiation through a mask; and then heating. The UV exposed areas of the coating comprise non-conductive polymer and the unexposed areas comprise conductive polymer. The formation of a conductive polymer pattern in accordance with this method does not require the coating and patterning of a separate photoresist layer.

U.S. Pat. No. 6,045,977 describes a process for patterning conductive polyaniline layers containing a photobase generator. UV exposure of such layers produces a base that reduces the conductivity in the exposed areas. EP-A-1 054 414 describes a method to pattern a conductive polymer layer by printing an electrode pattern onto said conductive polymer layer using a printing solution containing an oxidant selected from the group $ClO^-$, $BrO^-$, $MnO_4^-$, $Cr_2O_7^{2-}$, $S_2O_8^{-2}$, and $H_2O_2$. The areas of the conductive layer exposed to the oxidant solution are rendered nonconductive.

Research Disclosure, November 1998, page 1473 (disclosure no. 41548) describes various means to form patterns in conducting polymer, including photoablation wherein the selected areas are removed from the substrate by laser irradiation. Such photoablation processes are convenient, dry, one-step methods but the generation of debris may require a wet cleaning step and may contaminate the optics and mechanics of the laser device. Prior art methods involving removal of the electroconductive polymer to form the electrode pattern also induce a difference of the optical density between electroconductive and non-conductive areas of the patterned surface, which should be avoided.

Methods of patterning organic electroconductive polymer layers by image-wise heating by means of a laser have been disclosed in EP 1 079 397 A1. That method induces about a 10 to 1000 fold decrease in resistivity without substantially ablating or destroying the layer.

As indicated herein above, the art discloses a wide variety of electrically conductive TCL compositions. However, there is still a critical need in the art for a patterned conductive TCL structures. In addition to providing superior electrode performance, the TCL layers also must be highly transparent, must be patternable, must resist the effects of humidity change, and be manufacturable at a reasonable cost.

It is toward the objective of providing such improved electrically conductive, pattemable, preferably web coatable, thin films that more effectively meet the diverse commercial needs than those of the prior art that the present invention is directed.

SUMMARY OF THE INVENTION

The photopatternable element of this invention combines the use of thin films formulated using electrically conductive polymeric domains, with a photodoping imaging process to produce two or three dimensional electrode arrays such as are common in the art for memory and display applications. The thin film electrode array can be patterned by using a suitable actinic radiation exposure to provide a desired degree of photodoping and electrical conductivity.

An element for making patterns on an electroconductive substrate, the element comprising a support on which is disposed one or more photopatternable conductive layers; each layer comprising:

a) colloidal, electrically conductive polymer particles;
b) photohardenable microencapsulated particles containing conductivity enhancing or conductivity degrading conductivity modifier in reactive association with the electrically conductive polymer particles; and optionally
c) a polymeric binder.

The conductivity of such photodoped thin films can vary depending on the film formulation, layer thickness, choice of dopant, degree of photodoping and other factors readily apparent to one skilled in the art. The photodopant domains are situated "in proximity to" the electrically conductive domains. As used herein, "in proximity to" means that the two domains are in reactive association or are at least in two contiguous or adjacent layers so that the required level of imagewise photodoping of electrically conductive polymer can be achieved.

Also disclosed is a method for forming a pattern on an electrically conductive substrate comprising, the steps of:

a) subjecting a first substrate comprising microencapsulated photohardenable particles containing a conductivity enhancing or conductivity degrading modifier, and optionally, a polymeric binder to imagewise exposure with actinic radiation;

b) contacting the exposed first substrate with a second substrate comprising colloidal, electrically conductive polymer particles;

c) subjecting the two substrates that are in intimate contact to a uniform rupturing force, wherein the rupturing force releases and transfers the conductivity modifier from the microcapsules in the first substrate to the electrically conductive second substrate such that the resistivity in areas wherein transfer of the conductivity modifier occurs increases or decreases by at least a factor of 10; and optionally d) heating the electrically conductive substrate to fix the conductive pattern formed.

An alternative method involves:

a) subjecting a first substrate comprising microencapsulated photohardenable particles containing a conductivity enhancing or conductivity degrading modifier, and optionally, a polymeric binder to imagewise exposure with actinic radiation;

b) contacting the exposed first substrate with a second substrate comprising colloidal, electrically conductive polymer particles;

c) subjecting the two substrates that are in intimate contact to a uniform rupturing force, wherein the rupturing force releases and transfers the conductivity modifier from the microcapsules in the first substrate to the electrically conductive second substrate such that the resistivity in areas wherein transfer of the conductivity modifier occurs increases or decreases by at least a factor of 10; and optionally d) heating the electrically conductive substrate to fix the conductive pattern formed.

DETAILED DESCRIPTION

The photopattemable electrode layer (including microcapsules) is patterned by pressure development after imagewise exposure to actinic radiation. The microcapsules, whose mechanical strength changes (increases) when exposed to actinic radiation, are ruptured by means of pressure development, whereupon the conductivity modifier material and other substances encapsulated in the microcapsules flow out (to varying amounts based on the exposure level) and doping occurs. The conductivity modifier material, migrates to, and reacts with, the electrically conductive polymer material and alteration i.e. enhancement or degradation of conductivity occurs, whereupon an electrode pattern is developed.

The encapsulated conductivity modifiers of this invention can be incorporated in the layer adjacent to the layer containing electrically conductive domains or in reactive association with those domains. The development of two- or three-dimensional electrode pattern is accomplished by the application of uniform pressure to the imagewise exposed electrode element of this invention.

A typical photohardenable composition comprises a free radical addition polymerizable or crosslinkable compound, an ionic dye/reactive counter ion complex capable of absorbing actinic radiation and producing free radicals which initiate free radical polymerization or crosslinking of the polymerizable or crosslinkable compound.

Encapsulated is a photosensitive free radical, addition-polymerizable composition containing an autooxidizer, which functions as a co-initiator to enhance the speed of a polymerization reaction, which is triggered by absorption of actinic radiation.

In the imaging process described in the U.S. Pat. Nos. 4,399,209 and 4,840,866, the photosensitive monomer composition is encapsulated with a photoinitiator and an image-forming agent. Exposure of the imaging sheet hardens the internal phase of the microcapsules and renders them resistant to physical rupture. Thus, a latent image is formed as an image-wise pattern of hard (exposed) and soft (not exposed) microcapsules. The image is developed physically by passing the imaging element through the set of pressured rollers. Only the soft capsules rupture and deliver the image-forming agent, dissolved in the monomer, to the receiver sheet. The result is a direct positive of the original image. It has been shown that the exposure required to produce the first detectable loss in image density in the microencapsulated acrylate system is a function of the efficiency of photo-oxidation.

According to U.S. Pat. No. 5,320,982, a particular microencapsulated photohardenable composition has highly desirable film speed and shelf life, if microcapsules contain an internal phase with a disulfide in it, optionally in combination with a N, N-dialkylaniline. Such a composition comprises a free radical addition polymerizable or crosslinkable compound, an ionic dye/reactive counter ion complex capable of absorbing actinic radiation and producing free radicals which initiate free radical polymerization or crosslinking of said polymerizable or crosslinking compound, and an aromatic disulfide which functions at least in part as an autooxidizer capable of consuming oxygen in a free radical chain propagation.

The microcapsules may be produced using any known encapsulation technique such as coacervation, interfacial polymerization, polymerization of one or more monomers in an oil, etc. Suitable wall formers are known in the art and are referred to in U.S. Pat. No. 4,840,866 to Kovacs et al.

In a preferred manner of forming the microcapsules, a monomer (say, trimethylolpropane triacylate, TMPTA) is mixed with a Cyan color forming agent (Hilton Davis HD-5430), and a cationic dye/borate anion complex (say, 1,1'-dihexyl-3,3,3',3'-tetramethylindodicarbocyanine triphenyl-n-butyl borate) to form a "monomer mixture". The disulfide may be dissolved directly in the monomer mixture, or, if desired, pre-mixed with an additional amount of monomer, optionally in the presence of a mutual solvent, and is incorporated into the monomer mixture. In a separate vessel, an aqueous mixture is prepared with appropriate thickening agents, and the pH of the aqueous mixture is adjusted to a suitable level. To this aqueous mixture is added the monomer mixture while both are mixed with a turbine impeller so that emulsification occurs. During emulsification, the mixture is heated and an aqueous solution of urea, formaldehyde (37%) and resorcinol with ammonium sulfate is added at intervals to encapsulate the internal phase. Heating is continued until the desired wall thickness is obtained, and after curing, the pH is adjusted to about pH 9 using a 20% NaOH solution. Dry sodium bisulfite is added and the dispersion of microcapsules cooled to room temperature. A more detailed description is found in U.S. Pat. No. 4,842,980 to Gottschalk et al. If desired, the walls may be made with melamine instead of urea.

Disulfides described in U.S. Pat. No. 5,230,982 may be conventionally synthesized by subjecting a thiol starting material to an oxidative coupling reaction. Examples of such syntheses are set forth in Yoneda et al., "A New Hydrogen-Abstracting Reaction with Diethyl Azodicarboxylate", Journal of the American Chemical Society, 88:10, 1966; Mukaiyama et al., "A Convenient Method for the Preparation of Unsymmetrical Disulfides by the Use of Diethyl Azodicarboxylate," Tetrahedron Letters, 56, pp. 5907–5908, 1968. The coupling reaction can take place by the reaction of the thiol starting material with a strong electron accepting agent. Diethyl azodicarboxylate is a preferred electron accepting agent.

Disulfides are also conventionally prepared from substituted 2-mercaptobenzothiazoles, as for example described in "Synthesis of Derivatives of 4,5-dimethl-2-mercaptothiazole" by Floyd D. Stewart and Roger A. Mathes, J. Org. Chem, 14, (1949). The appropriate 2-mercaptobenzothiazole derivative provides a first aromatic sulfide radical which is single-bonded with a desired sulfenyl halide which is also conventionally prepared, for example, as described in syntheses disclosed in "One Hundred Years of Sulfenic Acid Chemistry IIb. Substitution and Cyclization of sulfenyl Halides, by Englebert Kuhle, Synthesis (1970). Particularly preferred are the disulfides of 2-mercaptobenzoxazole (MBO), 6-ethoxy-2-mercaptobenzothiazole (EMBT) and substituted mercaptotetrazole.

In addition to the disulfide autooxidizer, the photoinitiator compositions include an absorber, which either is a compound which absorbs actinic radiation and generates a free radical, or, is compound which absorbs radiation and reacts with a coinitiator to generate a free radical, the absorption depending upon the spectral sensitivity of the compound.

Absorbers include compounds conventionally used, or known in the art to be useful, as absorbers. These include (i) the ionic dye complexes, particularly the cationic dye-borate compounds; (ii) aryl benzophenones such as 4,4'-dimethoxybenzophenone, 4,4'-dichlorobenzophenone, 4,4'-bis(dimethylamino) benzophenone, benzanthone, 9-fluorenone; (iii) xanthones such as, xanthone, 2-methylaxanthone, 2-dode-cylxanthone, etc.; (iv) thioxanthones such as thioxanthone, 2-methylthioxanthone, 2-dodecylthioxanthone, 2-chlorothioxanthone, 2-isopropylthioxanthone, etc.; (v) ketocoumarins such as 3-cinnamoyl-7-diethylaminocoumarin; (vi) quinones such as phenanthrenequinones; and (vii) compounds such as 2-methyl-1-[4-(methylthio)phenyl]-2-morpholinopropanone-1.

Preferred among these absorbers are thioxanthones, phenanthraquinones, the morpholino compounds, and ketocoumarins. (Examples of ketocoumarins useful in the present invention are disclosed in U.S. Pat. No. 4,713,312 to Adair et al.).

Particularly preferred absorbers for the photosensitive material are the ionic dye complexes. These complexes are stable, non-transient compounds as opposed to the transient collision generated encounter complexes, exciplexes or contact ion pairs which may be encountered in some photohardenable compositions. Examples of ionic dye complexes are provided in U.S. Pat. No. 4,772,541.

A particularly useful ionic dye complex is a cationic dye-borate anion compound. Specific examples of cationic dye-borate anion compounds are shown in U.S. Pat. No. 4,772,541. Useful dyes form photoreducible, but dark stable, complexes with borate anions and can be cationic methine, polymethine, triarylmethane, indoline, thiazine, xanthene, oxazine and acridine dyes. More specifically, the dyes may be cationic cyanine, carbocyanine, hemicyanine, rhodamine and azomethine dyes. In addition to being cationic, the dyes should not contain groups which would neutralize or densensitize the complex or render the complex poorly dark stable. Specific examples of useful cationic dyes are Methylene Blue, Safranine O, and Malachite Green. Particularly preferred borate anions are triphenyl-butylborate, triphenylbenzylborate, triphenylsectuylborate, triphenylneopentylborate, and trianisylbutylborate because they readily dissociate to a triarylborane and an alkyl or aralkyl radical. On the other hand, tetrabutylborate anion does not work well possibly because the tetrabutylborate radical is not stable and it readily accepts an electron back from the dye in a back electron transfer and does not dissociate efficiently. Likewise, tetraphenylborate anion is very poor because the phenyl radical is not easily formed.

In addition to the foregoing compounds it may also be desirable to include an N,N-dialkylaniline compound in the photoinitiator composition as a co-initiator or as co-oxidant (depending upon the nature of the dialkylaniline). Representative examples of N,N-dialkylanilines useful in the present invention are 4-cyano-N,N-dimethylaniline, 4-acetyl-N,N-dirnethylaniline, 4-bromo-N,N-dimethylaniline, ethyl 4-(N,N-dimethylamino)benzoate, 3-chloro-N,N-dimetbylaniline, 4-chloro-N, N,N-dimethylaniline, 3-ethoxy-N,N-dimethylaniline, 4fluoro-N,N-dimethylaniline, 4-methyl-N,N-dimethylaniline, 4-ethoxy-N,N-dimethylaniline, N,N-dimethylthioanicidine, 4amino-N,N-dimethylaniline, 3-hydroxy-N,N-dimethylaniline, N,N,N', N'-tetramethyl-1,4-dianiline, 4-acetamido-N,N-dimethylaniline, etc.

Examples of more preferred N,N-dimethylanilines are dialky-lanilines substituted in the ortho-, meta- or para-position by the following groups: methyl ethyl, isopropyl, t-butyl, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgennanyl, trimethylstanyl, triethylstannyl, n-butoxy, n-pentyloxy, phenoxy, hydroxy, acetyloxy, methylthio, ethylthio, isopropyl- thio, thio-(mercapto-), acethylthio, fluoro, chloro, bromo and iodo. Examples of N,N-dialkylanilines useful as co-initiators are ethyl-p-(dimethylamino)benzoate (EPD), 2-n-butoxyethyl4-(dimethylamino)-benzoate, and ethyl o-(dimethylamino)-benzoate. N,N-dialkylanilines substituted with one or two alkyl groups in the ortho-position are often good autooxidizers. Examples of N,N-dialkylanilines typically useful as co-oxidants are 2,6-diisopropyl-N,N-dimethylaniline, 2,6-diethyl-N,N-dimethylaniline, N,N,2,4,6-pentamethylaniline and p-t-butyl-N,N-dimethylaniline.

According to U.S. Pat. No. 5,230,982 the disulfides act as particularly good autooxidizers when used in combination with cationic dye anionic borate absorbers and with N,N-dimethylanilines, and particularly with N,N-dimethylanilines substituted with one or two alkyl groups in the ortho-position. It had been proposed to use a thiol-aniline co-autooxidizer in association with the cationic dye-anionic borate absorber but a problem occurred by depletion of the borate anion at temperatures greater than 60° C. It is hypothesized that presence of the acidic hydrogen of the thiol group would undesirably react with the borate ion by attacking the carbon-boron bond. This depletes the amount of borate anion available to generate free radicals. As a result, the efficiency of the photoinitiator composition is significantly reduced. By using a disulfide compound instead of a simple thiol as an autooxidizer, the acidic hydrogen atom associated with the single thiol is eliminated. Accordingly, the disulfide compound does not attack the borate anion and as such, the amount of borate available to generate free radicals is not depleted. Thus, use of a disulfide compound as an autooxidizer can function to maximize the efficiency of the photoinitiator compound.

The photoinitiator composition is incorporated in the photohardenable composition in an amount sufficient to cause the composition to harden upon exposure to actinic radiation and more preferably in an amount sufficient to provide a low film speed. Typical compositions contain up to about 1 part of the absorber per 100 parts of the free radical polymerizable or crosslinkable compound and preferably about 0.5 to 1.5 parts per 100 parts of the free radical addition polymerizable or crosslinkable compound. The ratio will depend on the compounds selected, the extinction coefficients of the absorber, etc. as will be understood in the art.

Photoinitiator systems in accordance with the U.S. Pat. No. 5,230,982 may contain about 1.0 to 12% by weight of the disulfides based on the polymerizable monomer. When present, the N,N-dialkylanilines are used in an amount of about 1.0 to 6% by weight based on polymerizable monomers and the disulfides are used in an amount of about 0.5 to 12% by weight based on the amount of monomer. The photoinitiator composition can be used in combination with substantially any free radical addition polymerizable material. The most typical examples of a free radical addition polymerizable or crosslinkable material useful in the present invention are ethylenically unsaturated compounds and, more specifically, polyethylenically unsaturated compounds. These compounds include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include ethylene glycol diacrylate, ethylene glycol dimethacrylate, trimethylolpropene triacrylate (TMPTA), pentaerythritol tetraacrylate, pentaerythritol tetramethyacrylate, dipentaerythritol hydroxypentacrylate (DPHPA), hexanediol-1,6-dimethyacrylate, and diethyleneglycol dimethacrylate. While not desiring to be bound, use of disulfide compounds in association with photopolymerizable monomers is believed to provide more highly crosslinked and higher molecular weight polymers upon exposure of the monomers to actinic radiation. In prior art systems utilizing aniline or thiol autooxidizers, although the compounds have performed very well in their oxygen scavenging function, they tend to decrease the efficiency of the polymerization chemistry. It is hypothesized that when the anilines or thiols are used they function as a chain transfer agent. As a result, the molecular weight of the polymer produced is relatively low and exhibits reduced physical integrity. In embodiments where the polymer is encapsulated with an image-forming agent, the reduced integrity of the polymer may lead to softer capsules and cause unwanted image-forming agent to exude from the microcapsules upon the application of pressure. By comparison, when using a disulfide compound as an autooxidizer, it is believed a more highly crosslinked, higher molecular weight polymer results and concomitantly harder capsules are formed.

In accordance with this invention, a pattemable thin film element for use in a two- or three dimensional electrode array manufacturing process is comprised of a support, a photopattemable thin film structure, comprising particles of electronically-conductive polymer, and a photodoping composition dispersed in a film-forming hydrophilic or hydrophobic binder. The thin film elements of this invention can contain one or more photopattemable layers and such layers can be coated on any of a very wide variety of supports. Use of an electronically-conductive polymer-photodoping combination dispersed in a suitable film-forming binder enables the preparation of a patternable, thin, highly conductive, transparent layer which is strongly adherent to a support as well as to overlying layers. The electrical conductivity provided by the conductive layer of this invention is independent of relative humidity and persists even after exposure to aqueous solutions. The present invention provides a solution mixtures of an electronically conductive polymer (A), a conductivity modifier encapsulated in the photohardenable microencapsulated composition (B) and a polymeric binder. The preferred embodiment of the present invention provides aqueous mixtures of an electronically conductive polymer (A), a conductivity modifier encapsulated in the photohardenable microencapsulated composition (B) and a hydrophilic polymeric binder.

These aqueous formulations can be applied as thin layers to the substrate and by drying can be converted into photopatternable thin film electrode elements.

Preferred electrically conductive polymers (A) include polypyrrole/poly (styrene sulfonic acid), 3,4-dialkoxy substituted polypyrrole styrene sulfonate, and 3,4-dialkoxy substituted polythiophene styrene sulfonate. Especially preferred electrically conductive polymers are polythiophenes of formula (I).

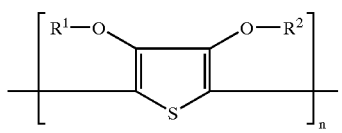

Polythiophene Formula wherein n is about 5 to 1000 and wherein $R_1$ and $R_2$ are independently hydrogen or a substituted or unsubstituted alkyl group having 1 to 4 carbon atoms, or together form a substituted or unsubstituted group or a substituted or unsubstituted 1,2-cyclohexylene group.
wherein n is about 5 to 1000 and wherein $R_1$ and $R_2$ are independently hydrogen or a substituted or unsubstituted alkyl group having 1 to 4 carbon atoms, or together form a substituted or unsubstituted group or a substituted or unsubstituted 1,2-cyclohexylene group.

The conductivity enhancing dopants (B-1) of this invention is:

a) represented by the following Formula II:

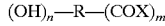

wherein m and n are independently an integer of from 1 to 20, R is an alkylene group having 2 to 20 carbon atoms, an arylene group having 6 to 14 carbon atoms in the arylene chain, a pyran group, or a furan group, and X is —OH or —NYZ, wherein Y and Z are independently hydrogen or an alkyl group; or b) a sugar, sugar derivative, polyalkylene glycol, or glycerol compound; or c) selected from the group consisting of N-methylpyrrolidone, pyrrolidone, caprolactam, N-methyl caprolactam, or N-octylpyrrolidone.

Examples of suitable organic compounds containing lactam groups are N-methylpyrrolidone, pyrrolidone, caprolactam, N-methylcaprolactam, N-octylpyrrolidone. Preferred radicals R are derived from the furan structure or the pyran structure.

Particularly preferred organic compounds (B-1) are: sugar and sugar derivatives such as sucrose, glucose, fructose, lactose; sugar alcohols such as sorbitol, mannitol; furan derivatives such as 2-furancarboxylic acid, 3-furancarboxylic acid; alcohols such as ethylene glycol, glycerol, di- or triethylene glycol.

The conductivity degrading dopants of this invention (B-2) include oxidants selected from the group: $ClO^-$, $BrO^-$, $MnO_4^-$, $Cr_2O_7^{-2}$, $S_2O_8^{-2}$, and $H_2O_2$. The areas of the conductive layer exposed to the oxidant dopant are rendered nonconductive.

The method for preparing the noted photopatternable thin film formulations in accordance with this invention comprises preparing a stable aqueous colloidal dispersion of one or more electrically conductive polymeric materials. Such colloidal dispersions are combined with at least one photohardenable microencapsulated dopant dispersion, one or more polymeric film-forming binders, thickeners, and other additives, and incorporated in photopatternable thin film element The electrically conductive polymer particles can be coated out of aqueous coating compositions. The polymers can be chosen from any or a combination of electrically conductive polymers, such as substituted or unsubstituted pyrrole-containing polymers (as mentioned for example, in U.S. Pat. Nos. 5,665,498 and 5,674,654), substituted or unsubstituted thiophene-containing polymers (as mentioned for example, in U.S. Pat. Nos. 5,300,575, 5,312,681, 5,354,613, 5,370,981, 5,372,924, 5,391,472, 5,403,467, 5,443,944, 5,575,898, 4,987,042, and 4,731,408), and substituted or unsubstituted aniline-containing polymers (as mentioned for example, in U.S. Pat. Nos. 5,716,550, 5,093,439, and 4,070,189).

The electrically conductive polymers may be soluble or dispersible in organic solvents or water or mixtures thereof. For environmental reasons, aqueous systems are preferred. Polyanions used in these electrically conductive polymers include the anions of polymeric carboxylic acids such as polyacrylic acids, poly(methacrylic acid), and poly(maleic acid), and polymeric sulfonic acids such as polystyrenesulfonic acids and polyvinylsulfonic acids, the polymeric sulfonic acids being preferred for use in this invention. These polycarboxylic and polysulfonic acids may also be copolymers formed from vinylcarboxylic and vinylsulfonic acid monomers copolymerized with other polymerizable monomers such as the esters of acrylic acid and styrene. The molecular weight of the polyacids providing the polyanions preferably is 1,000 to 2,000,000 and more preferably 2,000 to 500,000. The polyacids or their alkali salts are commonly available, for example as polystyrenesulfonic acids and polyacrylic acids, or they may be produced using known methods. Instead of the free acids required for the formation of the electrically conducting polymers and polyanions, mixtures of alkali salts of polyacids and appropriate amounts of monoacids may also be used.

Preferred electrically conductive polymers include polypyrrole/poly (styrene sulfonic acid), 3,4-dialkoxy substituted polypyrrole styrene sulfonate, and 3,4-dialkoxy substituted polythiophene styrene sulfonate.

Photohardenable imaging systems employing microencapsulated photosensitive compositions are the subject of various patents, including U.S. Pat. Nos. 4,399,209, 4,416,966, 4,440,846, 4,766,050, 5,783,353, and 5,916,727. Image forming devices (also referred to as printers) are disclosed, for example, in U.S. Pat. No. 4,740,809, wherein exposure occurs by guiding a light from a light source for a plurality of colors across a photosensitive recording medium. U.S. Pat. No. 4,992,822 discloses an image forming device, capable of producing a plurality of colors via a polygonal mirror, for repeatedly exposing the same pixels in a photosensitive recording medium. U.S. Pat. No. 5,893,662 discloses a device for printing an image wherein the device can be incorporated into a computer bay. U.S. Pat. No. 4,648,699 describes a development technique which employs, instead of a pair of nip rollers, a point contact ball moving relative to the photosensitive recording medium.

In the most typical embodiments, the photohardenable composition is a photopolymerizable composition including a polyethylenically unsaturated compound and a photoinitiator and is encapsulated together with a pattern former. Exposure to actinic radiation hardens the internal phase of the microcapsules. Then, as mentioned above, following exposure, the imaging media in the form of a sheet can be subjected to a uniform rupturing force by passing the sheet through the nip between a pair of pressure rollers.

In forming an electrode pattern conductivity modifiers which enhance or degrade the conductivity of electrically conductive polymers of these invention and photoinitiator(s) are encapsulated in an internal phase of the microcapsules, are mixed with conductive polymer dispersion and a solution of a binder to prepare a coating formulation for the fabrication of pattemable electrode element.

While combinations of the electrically conductive polymer particles and photohardenable microencapsulated conductivity modifier can be used without a binder in the various photopatternable formulations, preferably, they are dispersed in one or more hydrophilic polymeric, film-forming, binders. In such embodiments, the volume fraction of electrically conductive polymer is preferably in the range of from about 5 to 95% of the weight of the polymer particle/binder dispersion. Preferably, the weight % of polymeric particles is from about 10 to about 90%. The use of significantly less than about 5 weight % polymer particles will not provide a useful level of surface electrical conductivity. The optimum volume ratio of polymer particles to film-forming polymer binder varies depending on the electrical properties of the polymer, binder type, conductivity modifier type, and conductivity requirements of the particular thin film electrode material. The choice of the particular conductivity modifier to be used with the electrically conductive polymer in the patternable electrode element can be advantageous to the benefits provided by the present invention. The combination of conductivity modifier and electrically conductive polymer can be optimized so as to provide a maximum or minimum level of conductivity.

Polymeric film-forming binders useful in electrically conductive patternable thin film layers according to this invention include, but are not limited to, water-soluble or water-dispersible hydrophilic polymers such as gelatin, gelatin derivatives, maleic acid anhydride copolymers, cellulose derivatives (such as carboxymethyl cellulose, hydroxyethyl cellulose, cellulose acetate butyrate, diacetyl cellulose, and triacetyl cellulose), synthetic hydrophilic polymers (such as polyvinyl alcohol, poly-N-vinylpyrrolidone, acrylic acid copolymers, polyacrylamide, their derivatives and partially hydrolyzed products, vinyl polymers and copolymers such as polyvinyl acetate and polyacrylate acid ester), derivatives of the above noted polymers, and other hydrophilic synthetic resins that would be readily apparent to one skilled in the imaging arts. Other suitable binders include aqueous emulsions of addition-type polymers and interpolymers prepared from ethylenically unsaturated polymerizable monomers such as acrylates including acrylic acid, methacrylates including methacrylic acid, acrylamides and methacrylamides, itaconic acid and its half-esters and diesters, styrenes including substituted styrenes, acrylonitrile and methacrylonitrile, vinyl acetates, vinyl ethers, vinyl and vinylidene halides, and olefins and aqueous dispersions of polyurethanes or polyesterionomers. Gelatin and gelatin derivatives are the preferred binders in the practice of this invention.

Solvents useful for preparing dispersions and coatings of photopatternable thin films by the method of this invention include, but are not limited to water, alcohols (such as methanol, ethanol, propanol, and isopropanol), ketones (such as acetone, methyl ethyl ketone, and methyl isobutyl ketone), esters such as methyl acetate and ethyl acetate, glycol ethers such as methyl cellusolve, ethyl cellusolve), and mixtures of any of these solvents. Preferred solvents include water, alcohols, and acetone.

In addition to binders and solvents, other components that are well known in the art may also be included in the photopattemable thin films used in this invention. Such addenda include but are not limited to matting agents, surfactants or coating aids, polymer lattices to improve dimensional stability, thickeners or viscosity modifiers, hardeners or crosslinking agents, soluble antistatic agents, soluble and/or solid particle dyes, lubricating agents, and various other conventional additives readily apparent to one skilled in the art.

Colloidal dispersions of electronically-conductive polymer particles, photohardenable microencapsulated particles containing conductivity modifier(s), polymeric binders, and additives can be applied to a variety of flexible or rigid supports. The flexible support are preferable embodiments of this invention. Typical flexible film supports are preferred and include but are not limited to, cellulose nitrate, cellulose acetate, cellulose acetate butyrate, cellulose acetate propionate, poly(vinyl acetal), poly(carbonate), poly(styrene), poly(ethylene terephthalate), poly(ethylene naphthalate), poly(ethylene terephthalate), and poly(ethylene naphthalate) having included therein a portion of isophthalic acid, 1,4-cyclohexane dicarboxylic acid or 4,4-biphenyl dicarboxylic acid used in the preparation of the film support; polyesters wherein other glycols are employed such as, for example, cyclohexanedimethanol, 1,4-butanediol, diethylene glycol, polyethylene glycol, ionomers as described in U.S. Pat. No. 5,138,024, incorporated herein by reference (such as polyester ionomers prepared using a portion of the diacid in the form of 5-sodiosulfo-1, 3-isophthalic acid or like ion containing monomers), polycarbonates, and blends or laminates of the above noted polymers. Preferred photographic film supports are cellulose acetate, poly(ethylene terephthalate), and poly(ethylene naphthalate),and most preferably poly(ethylene naphthalate) that is prepared from 2,6-naphthalene dicarboxylic acids or derivatives thereof.

Suitable supports can be either transparent or opaque depending upon the application. Transparent film supports can be either colorless or colored by the addition of a dye or pigment. Film supports can be surface-treated by various processes including corona discharge, glow discharge, UV exposure, flame treatment, e-beam treatment, or treatment with adhesion-promoting agents including dichloro- and trichloroacetic acid, phenol derivatives such as resorcinol and p-chloro-m-cresol, solvent washing or overcoated with adhesion promoting primer or tie layers containing polymers such as vinylidene chloride-containing copolymers, butadiene-based copolymers, glycidyl acrylate or methacrylate-containing copolymers, maleic anhydride-containing copolymers, condensation polymers such as polyesters, polyamides, polyurethanes, polycarbonates, and mixtures and blends thereof Other suitable opaque or reflective supports are paper, polymer-coated papers, including polyethylene-, polypropylene-, and ethylene-butylene copolymer-coated or laminated paper, synthetic papers, and pigment-containing polyesters. Of these support materials, films of cellulose triacetate, poly(ethylene terephthalate), and poly(ethylene naphthalate) prepared from 2,6-naphthalene dicarboxylic acids or derivatives thereof are preferred.

The thickness of the support is not particularly critical. Support thickness of 0.50 to 10 mils (50 micrometers to 254 micrometers) are generally suitable for the materials of the present invention.

Formulations containing electronically-conductive polymer, photohardenable microencapsulated conductivity modifier and polymeric binder can be prepared in the presence of appropriate levels of optional dispersing aids, colloidal stabilizing agents or polymeric co-binders by any of various mechanical stirring, mixing, homogenization or blending processes. Stable colloidal dispersions of suitable electronically conductive polymer particles can be obtained commercially, for example, a stabilized dispersion of thiophene-containing polymer supplied by Bayer Corporation as Baytron P.

Formulations containing dispersions containing electronically-conductive polymer particles, photohardenable microencapsulated conductivity modifier, binder(s), and additives can be applied to the aforementioned supports by any of a variety of well-known coating methods. Hand coating techniques include using a coating rod or knife or a doctor blade. Machine coating methods include air doctor coating, reverse roll coating, gravure coating, curtain coating, bead coating, slide hopper coating, extrusion coating, spin coating and the like, and other coating methods well known in the art.

The photopatternable formulations can be applied to the support at any suitable coverage depending on the specific requirements of a particular type of imaging element. For example, dry coating weights of the preferred electrically conductive polymer particles dispersion in a photopatternable thin film are preferably in the range of from about 0.002 to about 0.5 g/m². More preferred dry coverage is in the range of from about 0.003 to about 0.1 g/m².

The electrodes formed by process of this invention typically exhibit a surface resistivity (at 20% relative humidity and 20° C.) of less than $1 \times 10^{10}$ ohms/square, preferably less than $1 \times 10^7$ ohms/square, and more preferably less than $1 \times 10^4$ ohms/square.

The photopatternable electrode elements described herein can be incorporated into multilayer structures in any of various configurations depending upon the requirements of the specific application. The photopatternable thin film electrode elements can be applied on either or both sides of the support.

What is claimed is:

1. An element for making electroconductive patterns on a substrate, the element comprising a support on which is disposed one or more photopatternable conductive layers; each photopatternable layer comprising:
   a) electrically conductive polymer and an optional binder; and
   b) microencapsulated photohardenable particles containing a conductivity enhancing or conductivity degrading modifier, the microencapsulated photohardenable particles being in close proximity to the electrically conductive polymer.

2. An element for making electroconductive patterns on a substrate, the element comprising a support on which is disposed one or more:
   a) electrically conductive layer comprising electrically conductive polymer, and optionally, a polymeric binder-, and
   b) at least one photopatternable layer, each photopatternable layer comprising microencapsulated photohardenable particles containing a conductivity enhancing or conductivity degrading modifier, the photohardenable layer being in close proximity to the electrically conductive layer.

3. The element of claim 1 or claim 2, for use in a two- or three-dimensional electrode array fabrication process.

4. The element of claim 1 or 2 further comprising one or more non-conductive auxiliary layers.

5. The element of claim 1 or 2 wherein the conductivity modifier is contained in a capsule comprising a photosensitive free radical addition-polymerizable composition containing an autooxidizer.

6. The element of claim 5 wherein the polymerizable composition comprises a free radical addition polymerizable or crosslinkable compound; an ionic dye and reactive counter ion complex capable of absorbing actinic radiation; and a disulfide.

7. The element of claim 5 wherein the capsule has a mean diameter from 0.1 to 25 microns.

8. The element of claim 1 or 2 wherein the binder is gelatin or modified gelatin.

9. The element of claim 1 or 2 wherein the conductivity enhancing modifier is:
   a) represented by the following Formula II:

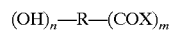

$$(OH)_n-R-(COX)_m \qquad \text{II}$$

wherein m and n are independently an integer of from 1 to 20, R is an alkylene group having 2 to 20 carbon atoms, an arylene group having 6 to 14 carbon atoms in the arylene chain, a pyran group, or a furan group, and X is —OH or —NYZ, wherein Y and Z are independently hydrogen or an alkyl group; or
   b) a sugar, sugar derivative, polyalkylene glycol, or glycerol compound; or
   c) selected from the group consisting of N-methylpyrrolidone, pyrrolidone, caprolactam, N-methyl caprolactam, or N-octylpyrrolidone.

10. The element of claim 1 or 2 wherein said conductivity enhancing modifier is a N-methylpyrrolidone, pyrrolidone, caprolactam, N-methylcaprolactam, N-octylpyrrolidone, sucrose, glucose, fructose, lactose, sugar alcohol, 2-furan carboxylic acid, 3-furan carboxylic acid, sorbitol, glycol, ethylene glycol, glycerol, diethylene glycol, or triethylene glycol, or a mixture of any two or more of these compounds.

11. The element of claim 1 or 2 wherein the conductivity enhancing modifier is N-methylpyrrolidone, pyrrolidone, caprolactam, N-methyl caprolactam, or N-octylpyrrolidone.

12. The element of claim 1 or 2 wherein the conductivity enhancing modifier is ethylene glycol, diethylene glycol or glycerol.

13. The element of claim 1 or 2 wherein the conductivity degrading modifier includes oxidants selected from the group consisting of $ClO^-$, $BrO^-$, $MnO_4^-$, $Cr_2O_7^{-2}$, $-S_2O_8^{-2}$, and $H_2O_2$.

14. The element of claim 1 or 2 wherein the electronically conductive polymer particles comprise a polythiophene present in a cationic form with a polyanion, said polythiophene comprising recurring units defined by the following Formula I

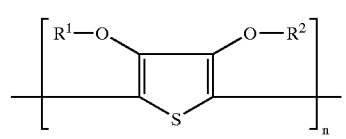

wherein each of R1 and R2 independently represents hydrogen or a C1–C4 alkyl group or together represent an optionally substituted C1–C4 alkylene group or a cycloalkylene group, preferably an ethylene group, an optionally alkyl-substituted methylene group, an optionally C1–C12 alkyl- or phenyl-substituted 1,2-ethylene group, a 1,3-propylene group or a 1,2-cyclohexylene group and n is 5–1000.

15. A method for forming an electrically conductive pattern on a substrate, the substrate comprising electrically conductive polymer, microencapsulated photohardenable particles containing a conductivity enhancing or conductivity degrading modifier, and optionally, a polymeric binder, the method comprising, the steps of:
   a) subjecting the element to imagewise exposure with actinic radiation;
   wherein actinic radiation exposure hardens the internal phase of the microcapsule;
   b) subjecting the exposed element to a uniform rupturing force, wherein the rupturing force releases the conductivity modifier from unhardened microcapsules such that resistivity in areas contacted by the conductivity modifier increases or decreases by at least a factor of 10; and optionally
   c) heating the substrate to fix the conductive pattern formed.

16. A method for forming an electrically conductive pattern on a substrate comprising, the steps of:
   a) subjecting a first substrate comprising microencapsulated photohardenable particles containing a conductivity enhancing or conductivity degrading modifier, and optionally, a polymeric binder to imagewise exposure with actinic radiation; wherein actinic radiation exposure hardens the internal phase of the microcapsules;
   b) contacting the exposed first substrate with a second substrate comprising electrically conductive polymer;
   c) subjecting the two substrates that are in intimate contact to a uniform rupturing force, wherein the rupturing force releases and transfers the conductivity modifier from the unhardened microcapsules in the first substrate to the electrically conductive second substrate such that the resistivity in areas wherein transfer of the conductivity modifier occurs increases or decreases by at least a factor of 10; and optionally,
   d) heating the electrically conductive substrate to fix the conductive pattern formed.

17. The method of claim 15 or claim 16 wherein resistivity in areas contacted by the conductivity modifier increases or decreases by at least a factor of 100.

18. The method of claim 15 or claim 16 wherein resistivity in areas contacted by the conductivity modifier increases or decreases by at least a factor of 1000.

19. The method of claim 15 or 16 wherein the conductivity modifier is:
   a) represented by the following Formula II:

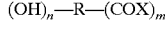  II wherein m and n are independently an integer of from 1 to 20, R is an alkylene group having 2 to 20 carbon atoms, an arylene group having 6 to 14 carbon atoms in the arylene chain, a pyran group, or a furan group, and X is —OH or —NYZ, wherein Y and Z are independently hydrogen or an alkyl group; or
   b) a sugar, sugar derivative, polyalkylene glycol, or glycerol compound; or
   c) selected from the group consisting of N-methylpyrrolidone, pyrrolidone, caprolactam, N-methyl caprolactam, or N-octylpyrrolidone.

20. The method of claim 15 or 16 wherein the conductivity enhancing modifier is N-methylpyrrolidone, pyrrolidone, caprolactam, N-methylcaprolactam, N-octylpyrrolidone, sucrose, glucose, fructose, lactose, sugar alcohol, 2-furan carboxylic acid, 3-furan carboxylic acid, sorbitol, glycol, ethylene glycol, glycerol, diethylene glycol, or triethylene glycol, or a mixture of any two or more of these compounds.

21. The method of claim 15 or 16 wherein the conductivity enhancing modifier is N-methylpyrrolidone, pyrrolidone, caprolactam, N-methyl caprolactam, or N-octylpyrrolidone.

22. The method of claim 15 or 16 wherein the conductivity enhancing modifier is ethylene glycol, diethylene glycol or glycerol.

23. The method of claim 15 or 16 wherein the conductivity degrading modifier includes oxidants selected from the group consisting of $ClO^-$, $BrO^-$, $MnO_4^-$, $Cr_2O_7^{-2}$, $S_2O_8^{-2}$, and $H_2O_2$.

24. The method of claim 19 wherein n and m independently of one another denote an integer from 2 to 8.

25. The method of claim 15 or 16 wherein the conductivity enhancing compound is sucrose, glucose, fructose, lactose, sorbitol, mannitol, 2-furancarboxylic acid, 3-furancarboxylic acid, ethylene glycol, glycerol, di-or triethylene glycol.

26. The method of claim 15 or 16 wherein the concentration of conductivity modifier in the photohardenable particles is 0.01 to 30 wt. % based on the weight of the photohardenable particles.

27. The method of claim 15 or 16 wherein the concentration of conductivity modifier in the photohardenable particles is 0.5 to 10 wt. % based on the weight of the photohardenable particles.

28. The method of claim 15 or 16 wherein the concentration of conductivity modifying agent in the photohardenable particles is 0.5 to 5 wt. % based on the weight of the photohardenable particles.

29. The method of claim 15 or 16 wherein the photohardenable particles have a particle size of 0.05 micron to 20 microns.

30. The method of claim 15 or 16 wherein the photohardenable particles of have a particle size of 0.1 micron to 2.0 microns.

31. The element of claim 1 or 2 wherein the layer containing the conductive polymer contains 100 to 1000 mg/m² dry coating weight of the conductive polymer.

32. The element of claim 1 or 2 wherein the layer containing the conductive polymer contains 20 to 500 mg/m² dry coating weight of the conductive polymer.

33. The element of claim 1 or 2 wherein the conductive polymer is a substituted or unsubstituted pyrrole-containing polymer, a substituted or unsubstituted thiophene-containing polymer, or a substituted or unsubstituted aniline-containing polymer.

34. The element of claim 1 or 2 wherein the layer containing the conductive polymer comprises a mixture containing:
   a) polythiophene according to Formula I;

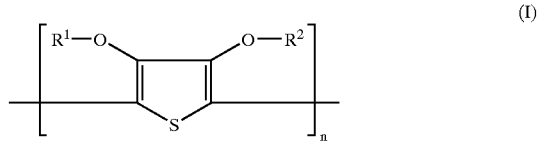

Polythiophene Formula wherein each of $R^1$ and $R^2$ independently represents hydrogen or a C1–C4 alkyl group or together represent an optionally substituted C1–C4 alkylene group or a cycloalkylene group, preferably an ethylene group, an optionally alkyl-substituted methylene group, an optionally C1–C12 alkyl- or phenyl-substituted 1,2-ethylene group, a 1,3-propylene group or a 1,2-cyclohexylene group and n is 5–1000;

b) a polyanion compound; and optionally c) a film forming polymeric binder.

35. The element of claim 1 or 2 wherein the polyanion is an anion of a polymeric carboxylic acid.

36. The element of claim 1 or 2 wherein the polyanion is a polyacrylic acid, a poly(methacrylic acid), a poly(maleic acid), or a polymeric sulfonic acid.

37. The element of claim 1 or 2 wherein the polyanion is a polystyrenesulfonic acid or a polyvinylsulfonic acid.

38. The element of claim 1 or 2 wherein the film-forming polymeric binder comprises from 5 to 95 wt % of the layer containing the conductive polymer.

39. The element of claim 1 or 2 wherein the film-forming polymeric binder is gelatin or gelatin derivatives.

* * * * *